US006406545B2

(12) United States Patent
Shoda et al.

(10) Patent No.: US 6,406,545 B2
(45) Date of Patent: *Jun. 18, 2002

(54) SEMICONDUCTOR WORKPIECE PROCESSING APPARATUS AND METHOD

(75) Inventors: Naohiro Shoda, Wappinger Falls; Peter Weigand, North Croton on Hudson, both of NY (US)

(73) Assignee: Kabushiki Kaisha Toshiba, Kawasaki (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/361,304

(22) Filed: Jul. 27, 1999

(51) Int. Cl.[7] .......................... C23C 16/00; H05H 1/00; H01L 21/00
(52) U.S. Cl. ....................... 118/724; 118/725; 118/728; 118/723 E; 156/345.51; 156/345.52; 156/345.53; 156/345.47; 438/715
(58) Field of Search ................................ 118/724, 725, 118/723 E, 723 R, 500, 728; 156/345.51, 345.52, 345.53, 345.47; 204/298.07–298.09, 298.15, 298.33; 438/715

(56) References Cited

U.S. PATENT DOCUMENTS

| 4,508,161 A | 4/1985 | Holden ........................... 165/1 |
| 4,944,860 A | 7/1990 | Bramhall, Jr. et al. .. 204/298.23 |
| 4,971,653 A | 11/1990 | Powell et al. ................. 156/626 |
| 5,173,440 A | 12/1992 | Tsunashima et al. ......... 437/164 |
| 5,213,349 A | 5/1993 | Elliott ........................ 279/128 |
| 5,290,381 A | 3/1994 | Nozawa et al. ............. 156/345 |
| 5,324,686 A | 6/1994 | Tsunashima ................. 437/152 |
| 5,382,311 A | 1/1995 | Ishikawa et al. ............ 156/345 |
| 5,458,687 A | 10/1995 | Shichida et al. ............ 118/724 |
| 5,462,603 A | 10/1995 | Murakami .................. 118/719 |
| 5,518,593 A | 5/1996 | Hosokawa et al. .... 204/192.12 |
| 5,527,392 A | 6/1996 | Snail et al. .................. 118/725 |
| 5,542,559 A | 8/1996 | Kawakami et al. ........... 216/67 |
| 5,567,267 A | 10/1996 | Kazama et al. ............. 156/345 |
| 6,072,685 A | * 6/2000 | Herchen ..................... 361/234 |
| 6,074,488 A | * 6/2000 | Roderick et al. ........... 118/728 |

FOREIGN PATENT DOCUMENTS

| EP | 0 790 641 A1 | 8/1997 | |
| JP | 2-7520 A | * 1/1990 | ......... H01L/21/302 |
| JP | 3-194948 A | * 8/1991 | ........... H01L/21/68 |
| JP | 11-111826 A | * 4/1999 | ........... H01L/21/68 |
| WO | WO 97/19303 | 5/1997 | |

OTHER PUBLICATIONS

International Search Report.

* cited by examiner

Primary Examiner—Gregory Mills
Assistant Examiner—P. Hassanzadeh
(74) Attorney, Agent, or Firm—Banner & Witcoff, Ltd.

(57) ABSTRACT

A wafer processing apparatus includes a processing chamber, a chuck arranged in the processing chamber for supporting a wafer, and a pedestal which is spaced apart from the chuck. A first gas layer is provided between the chuck and the wafer and a second gas layer is provided in the space between the pedestal and the chuck. The pressure of the first gas layer is controlled to be in a pressure range in which a thermal conductivity of the first gas layer is substantially constant with respect to changes in pressure of the first gas layer and the pressure of the second gas layer is controlled so as to control an amount of heat transferred to/from the pedestal.

61 Claims, 8 Drawing Sheets

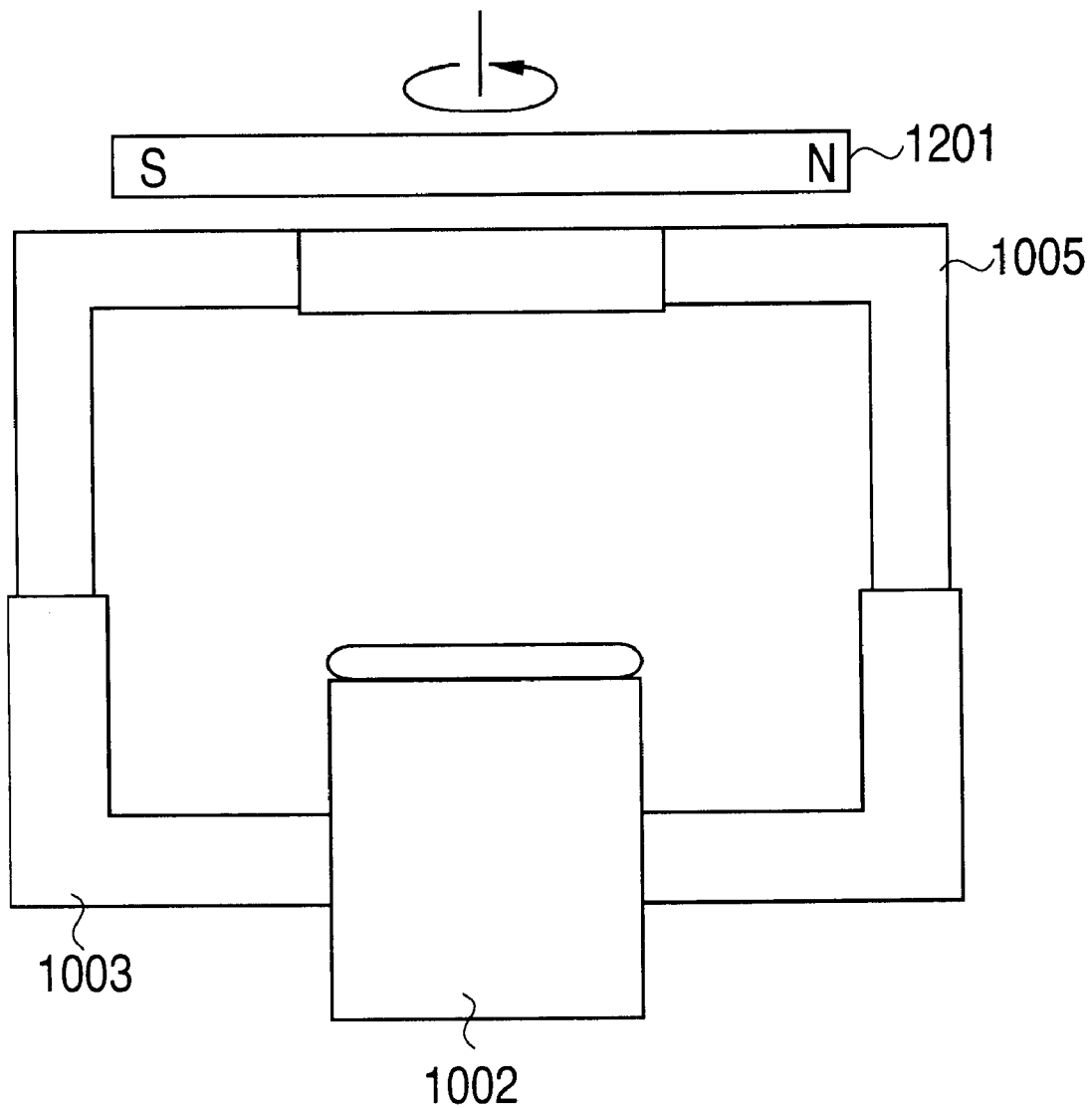

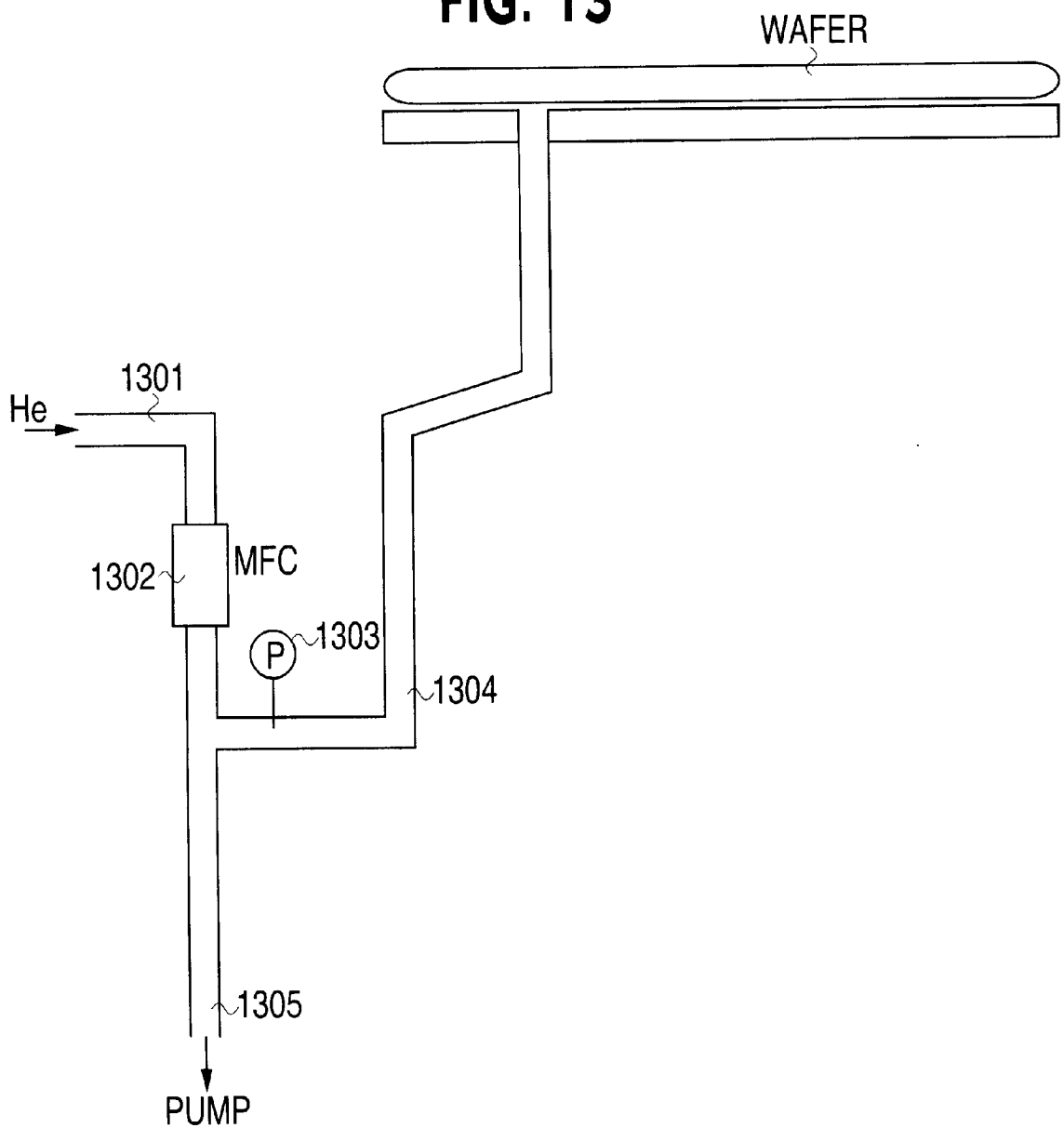

SEMICONDUCTOR WORKPIECE PROCESSING APPARATUS AND METHOD

FIELD OF INVENTION

The present invention generally relates to methods and apparatus for processing semiconductor workpieces and, more particularly, to temperature control and monitoring during the processing of semiconductor workpieces.

BACKGROUND

During certain processing (e.g., plasma etching or deposition) of a semiconductor workpiece such as a semiconductor wafer of silicon, the workpiece is arranged on a susceptor disposed in a processing chamber. Electrostatic chucks are widely used to hold the semiconductor wafers in place on the susceptor during the processing using an electrostatic force produced by a DC bias voltage. The chuck may comprise an electrode arranged between two dielectric layers, wherein the electrode is connected to the DC bias voltage. FIG. 1 is a general block diagram of a conventional processing chamber which includes a processing chamber 10 defined by chamber walls 12. A semiconductor wafer W to be processed is arranged on a susceptor 14 and is held in place by an electrostatic chuck. The DC bias voltage for the electrostatic chuck is provided by a DC power supply 16. A vacuum port 18 is provided to evacuate processing chamber 10. Process gases for effecting a particular etching or deposition process are introduced into processing chamber 10. A magnetic field generator (not shown) (such as a solenoid or a permanent magnet) arranged outside the chamber and an RF power supply 20 are used to generate a plasma having ions and electrons which are incident on the wafer with a desired energy. The magnetic field generator is not necessary, but tools incorporate it to increase plasma density. Other wafer processing apparatuses are described in U.S. Pat. Nos. 5,567,267; 5,542,559; 5,462,603; 5,458,687; 5,382,311; and 5,290,381.

During processing, heat is generated by the energy of the ions and electrons incident on the wafer and the chemical reaction between the plasma and the wafer. With reference to FIG. 2, susceptor 14 is cooled using a cooling medium such as water which is circulated through a cooling medium passage 30 formed in susceptor 14. In order to control the temperature of the wafer W by transferring heat from the wafer to susceptor 14, helium or some other heat transfer gas is provided in a space 32 between the lower surface of the wafer W and the upper dielectric layer of the electrostatic chuck. The helium gas is provided to space 32 via a gas passage 34 formed in susceptor 14. By controlling the heat conductivity of the helium (and thus the amount of heat which is transferred to the cooled susceptor), the temperature of the wafer may be controlled. Since, in certain pressure ranges, the thermal conductivity of helium varies as a function of the pressure of the helium, controlling the pressure of the helium using a pressure controller 36 permits control of the thermal conductivity of the helium and therefore the amount of heat which is transferred from the heated wafer to the cooled susceptor.

It is often important to control the wafer temperature to be at a particular temperature or in a particular temperature range during processing. For example, if the temperature is too low, there is the possibility that water will be incorporated into the film being deposited on the wafer, which can adversely affect the operating characteristics and reliability of the completed device. On the other hand, a temperature which is too high can, for example, lead to undesirable melting of previously deposited metal wiring layers such as aluminum wiring layers and unwanted diffusion of impurities previously implanted in the wafer. When the helium is supplied to space 32 between wafer W and the electrostatic chuck, the helium generally leaks from the edges of the wafer as shown in FIG. 2 and the helium pressure is reduced at these edge portions. This reduction in pressure reduces the thermal conductivity of the helium at these edge portions. This reduced thermal conductivity reduces the amount of heat transferred to the susceptor 14 from the edge portions of the wafer as compared to the amount of heat transferred to the susceptor 14 from the central portions of the wafer. Thus, the temperature at these edge portions of the wafer is increased relative to the temperature at the central portions of the wafer. This non-uniform wafer temperature makes temperature control of the wafer difficult since different portions of the wafer will be at different temperatures.

The need to control the wafer temperature to be within a certain temperature range also makes it desirable to have a convenient mechanism for measuring wafer temperature. While wafer temperature may be easily measured with a thermocouple, this technique may be used only with monitor (test) wafers and not for actual production wafers. Wafer temperature may also be measured by detecting infrared emissions from the wafer. However, since silicon wafers are essentially transparent to infrared radiation, a detector for detecting infrared radiation will detect infrared radiation from the substrate, thereby resulting in an inaccurate temperature measurement.

SUMMARY OF THE INVENTION

A wafer processing apparatus includes a processing chamber, a chuck arranged in the processing chamber for supporting a wafer, and a pedestal that is spaced apart from the chuck. A first thermal transfer gas layer is provided between the chuck and the wafer and a second thermal transfer gas is provided in the space between the pedestal and the chuck. The pressure of the first thermal gas layer is controlled to be in a pressure range in which a thermal conductivity of the first thermal transfer gas is substantially constant with respect to changes in pressure and the pressure of the second thermal transfer gas layer is controlled so as to control an amount of heat transferred to the pedestal.

Since the pressure of the first thermal transfer gas layer between the wafer and the chuck is maintained in a range in which the thermal conductivity of the first thermal transfer gas does not vary significantly with respect to changes in the pressure of the first thermal transfer gas, leaks at the edge of the wafer do not significantly affect the temperature uniformity of the wafer. The temperature of the wafer and the chuck is controlled by the pressure of the second thermal transfer gas layer provided in a space between the chuck and the pedestal. The edges of this space are sealed with a thermal insulator and thus uniform thermal conductivity across the wafer may be provided. Since the first thermal transfer gas layer provides low thermal resistance, the temperature of the wafer is substantially the same as the temperature of the chuck. Thus, the temperature of the wafer may be determined using, for example, a thermocouple arranged on the chuck. This temperature information is supplied to a system control computer. Using this temperature information, the system control computer controls the pressure of the second thermal transfer gas layer to thereby control the temperature of the wafer and the chuck.

The present application also describes a wafer processing method and a control circuit for a wafer processing apparatus.

These and other features and aspects of the invention will be more clearly understood and better described if the following detailed description is read in conjunction with the appended drawings.

BRIEF DESCRIPTION OF THE DRAWINGS

FIG. 12 is a cross-section of the chamber with a permanent magnet in accordance with embodiments of the present invention.

FIG. 13 is a piping diagram as relating to a mass flow control in accordance with embodiments of the present invention.

DETAILED DESCRIPTION

Figure 1:
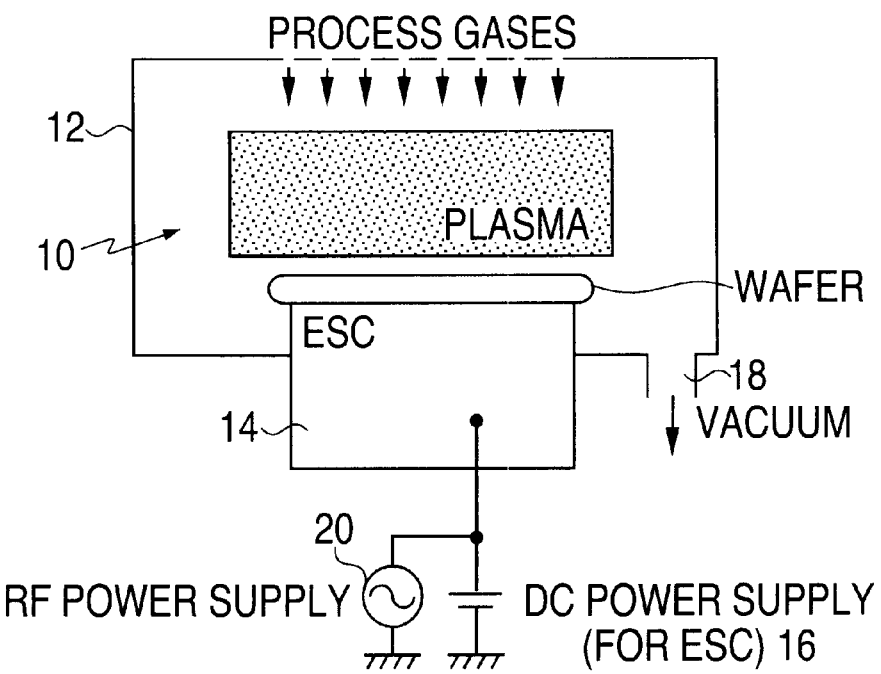
FIG. 1 is a general block diagram of a conventional processing chamber for processing semiconductor wafers.
Figure 2:
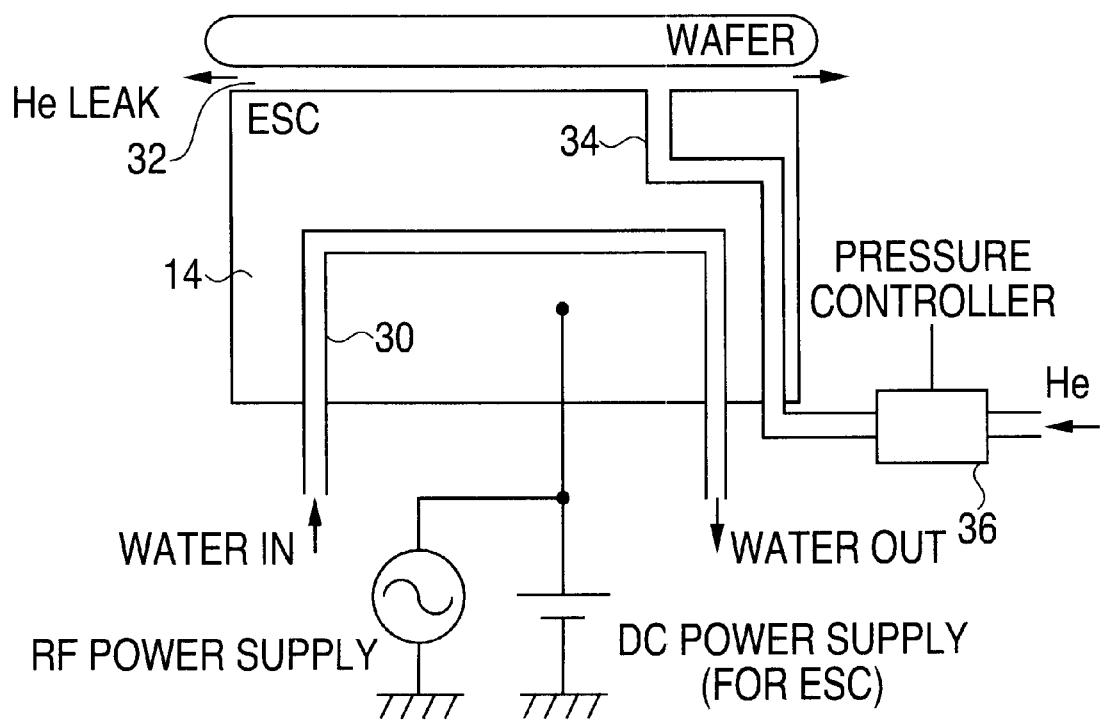
FIG. 2 is a more detailed block diagram of the susceptor 14 of FIG. 1.
Figure 3:
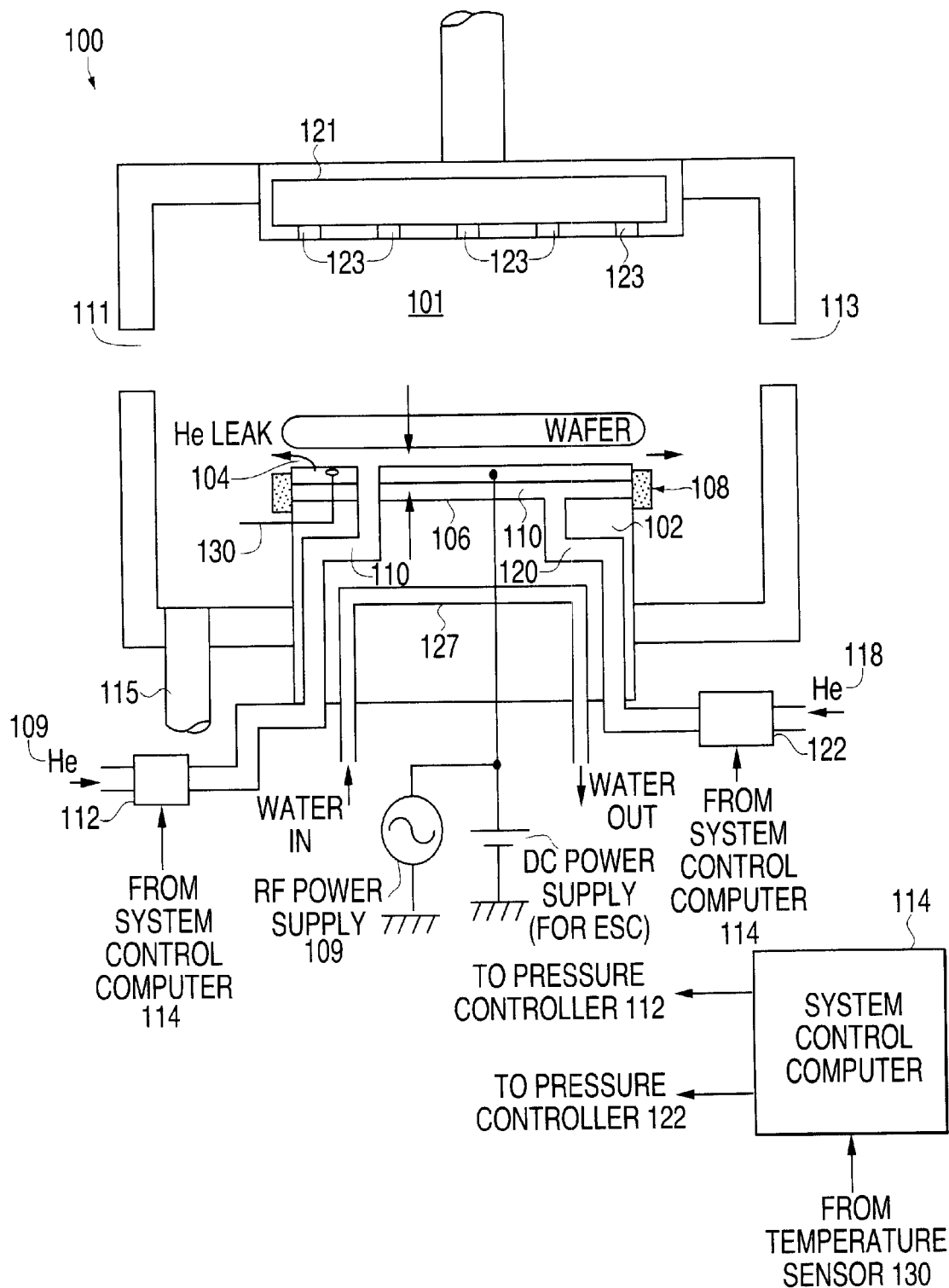
FIG. 3 is a detailed block diagram of a processing chamber in accordance with the present invention.

The features of a semiconductor workpiece processing apparatus 100 in accordance with the present invention are shown in FIG. 3. For purposes of the discussion below, the semiconductor workpiece is assumed to be a semiconductor wafer of silicon, but the invention is not limited in this respect. While the processing apparatus of FIG. 3 is a high density plasma deposition/etching tool, the invention is generally applicable to tools for thermal chemical vapor deposition, plasma enhanced chemical vapor deposition, chemical dry etching, reactive ion etching, resist ashing, sputter etching, and the like. Wafer processing apparatus 100 includes pedestal 102 and a plate 104.

Figure 5:
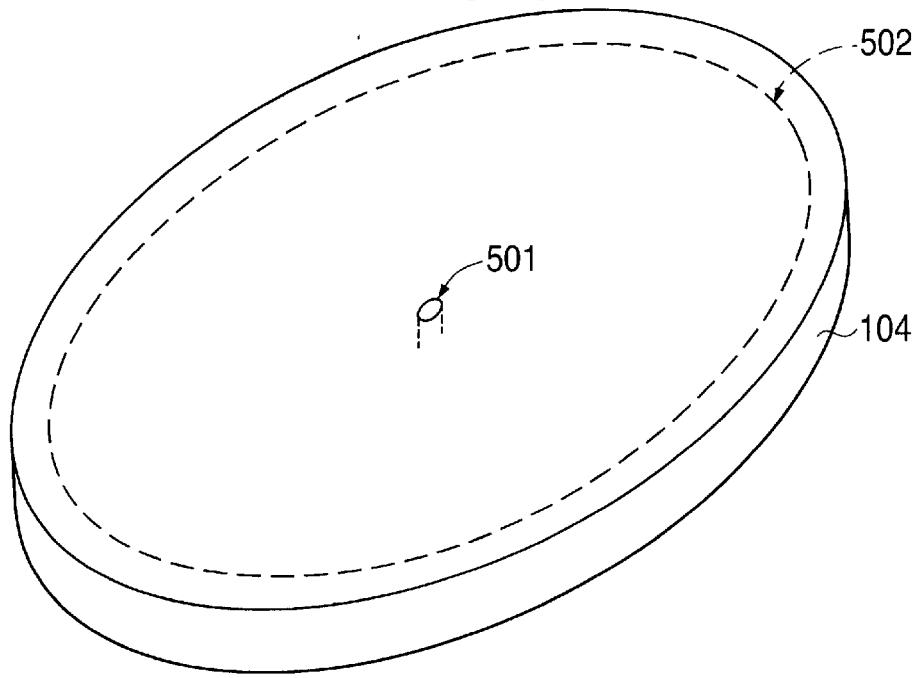
FIG. 5 is a perspective view of plate 104 as containing an electrode in accordance with the present invention.

For purposes of illustration, plate 104 is also shown in FIG. 5. Possible dimensions are listed as follows:

Diameter: 198 mm

Thickness: 3 mm

Material: Ceramic (alumina, for example)

Figure 6:
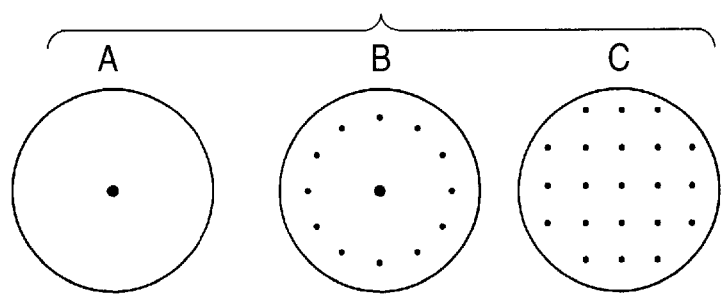
FIG. 6 are various representations of the plate 104 as containing various through holes in accordance with embodiments of the present invention.

The above dimensions are for a 8 inch wafer. In this example, the diameter of the plate is slightly smaller than the diameter of the wafer. Other size plates may be used for other size wafers. FIG. 5 shows plate 104 with electrode 502 inside. He pass through hole 501 is shown in the center of the plate. FIGS. 6A–C show other configurations for pass through hole 501 as including in the center of the plate (FIG. 6A), in the center of the plate and arranged in a ring (FIG. 6B), and arranged in a grid (FIG. 6C).

Figure 7:
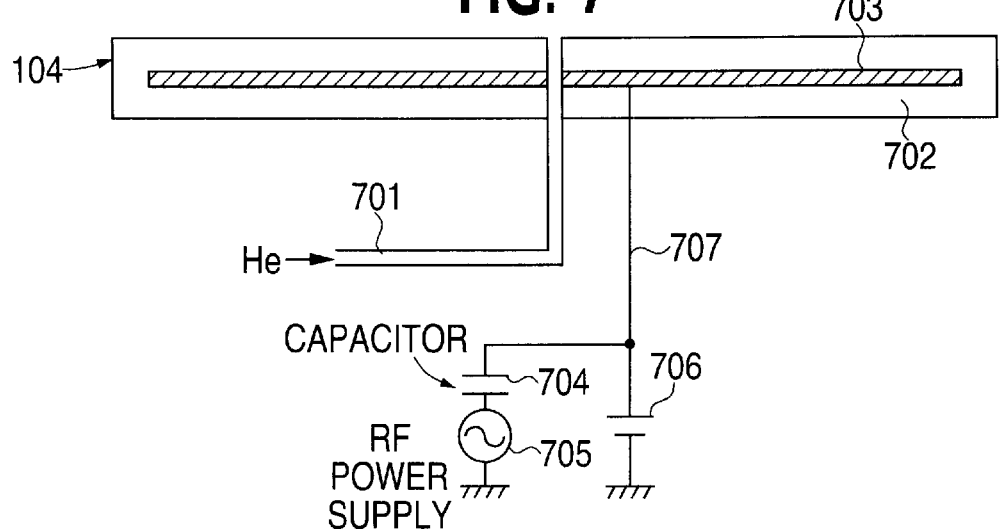
FIG. 7 is a block diagram showing the plate 104 with an electrode in accordance with embodiments of the present invention.

Referring to FIG. 3, plate 104 is spaced from an upper surface 106 of pedestal 102 using an O-ring 108 to thereby define an opening 110. The range of spacing is between 10 and 50 microns (for example). Other spacings may be used as appropriate. O-ring 108 is formed of a material having a low thermal conductivity such as a ceramic material (e.g., alumina). An electrostatic chuck (as shown in FIG. 7, a monopole electrostatic chuck) comprising, for example, a conductive layer 703 (e.g., a copper foil) sandwiched between two dielectric layers 702 is formed on the upper surface of plate 104. A wire 707 is connected to the conductive layer for supplying DC power (with DC power supply 706) thereto. It is noted that RF power may be supplied through RF power supply 705 to wire 707. Capacitor 704 is included so as to prevent low frequency noise from being transmitted to electrode 703. Alternative embodiments do not use RF power being supplied directly to the plate, as they rely on the RF power to be supplied from other sources as treated below.

Figure 8:
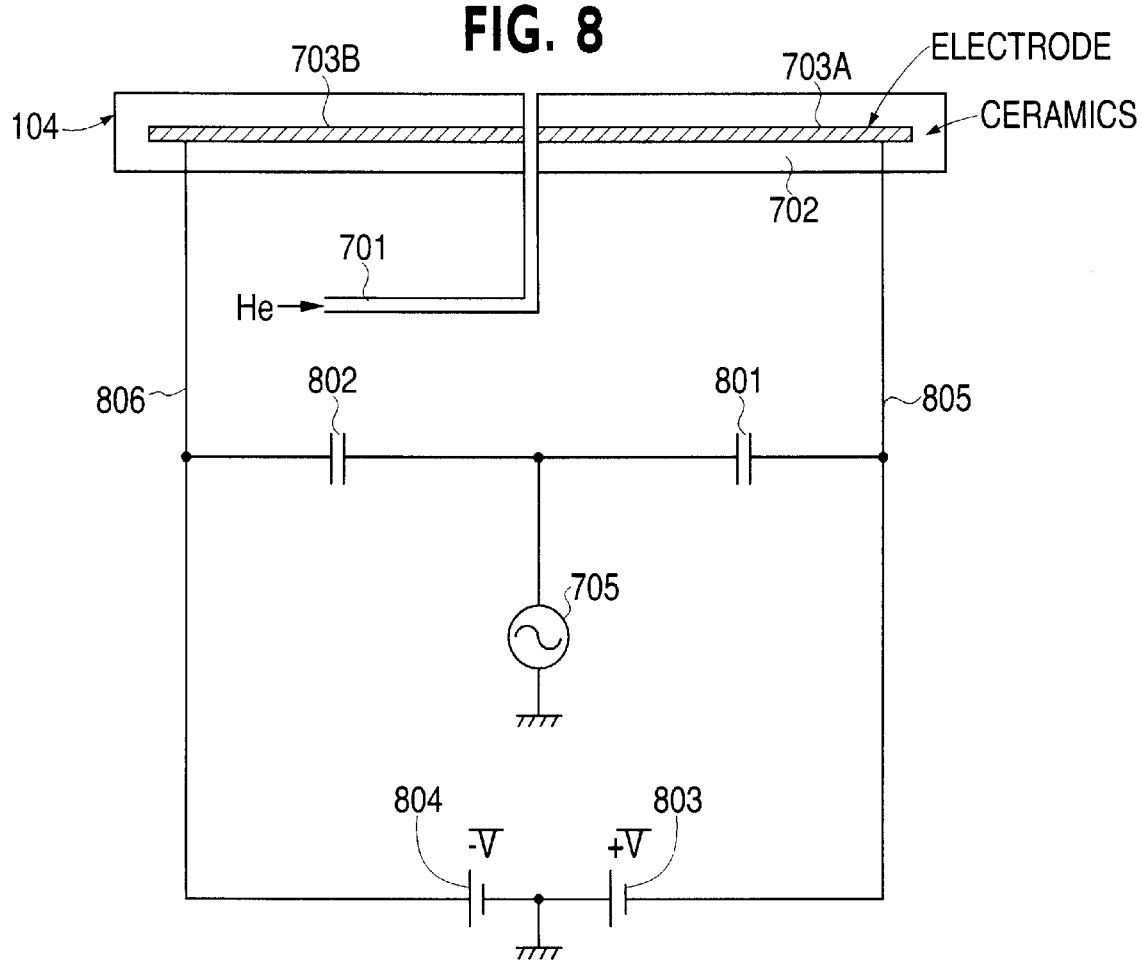
FIG. 8 is a block diagram showing the plate 104 with electrodes in accordance with embodiments of the present invention.
Figure 9:
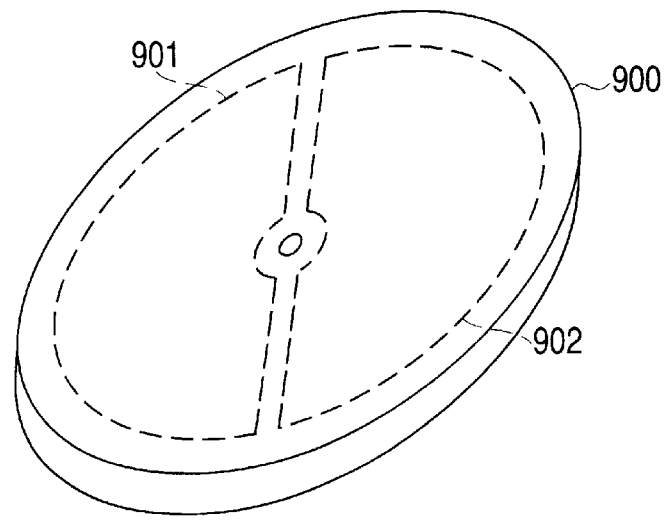
FIG. 9 is a perspective view of plate 104 as containing electrodes in accordance with embodiments of the present invention.

FIG. 8 shows a dipole electrostatic chuck as an alternative to the monopole electrostatic chuck of FIG. 7. Similar to the construction of the electrostatic chuck of FIG. 7, the dipole electrostatic chuck includes capacitors 801 and 802 located between RF source 705 and leads 805, 806 connected to electrodes 703A, 703B, respectively. Also, DC bias voltage is generated for the two electrodes 703A, 703B by DC bias generators 803 and 804, respectively. The DC voltage applied to electrodes 703A and 703B are of the opposite polarity. The various arrangement of the electrodes 703A and 703B are represented in FIG. 9 as electrodes 902 and 901, respectively.

The arrangement of plate 104 and O-ring 108 as shown in FIG. 3 is a particularly convenient arrangement for configuring existing wafer processing apparatuses to implement the present invention. However, the present invention is not limited in this respect and other configurations that provide a space underneath the electrostatic chuck may be utilized.

A wafer W is loaded onto and unloaded from plate 104 using a wafer conveying apparatus (not shown). The wafer conveying apparatus loads and unloads the wafer via ports 111 and 113. Ports 111 and 113 are formed in the sidewalls of processing chamber 101 and these ports are opened to load and unload the wafer and closed during processing the wafer. The vacuum port 115 is provided to evacuate processing chamber 101. Process gases for effecting a particular etching technique or deposition process, for example, are introduced into processing chamber 101 via a gas supply section 11 having a plurality of openings 123. A magnetic filed generator (not shown) such as a solenoid or a permanent magnet is arranged outside the processing chamber. The magnetic field generator generates a magnetic field horizontal or perpendicular to the surface of the wafer W to be processed. The magnetic field and an electric field (which is generated by RF power supply 109) are used to generate a plasma having ions and electrons which are incident on the wafer with a desired energy. The walls of the chamber are grounded. The plate 104 is insulated from the chamber walls by the O-ring. The top of chamber 100 is transparent to the magnetic field. Plate 104 constitutes a second electrode serving as a susceptor.

Figure 10:
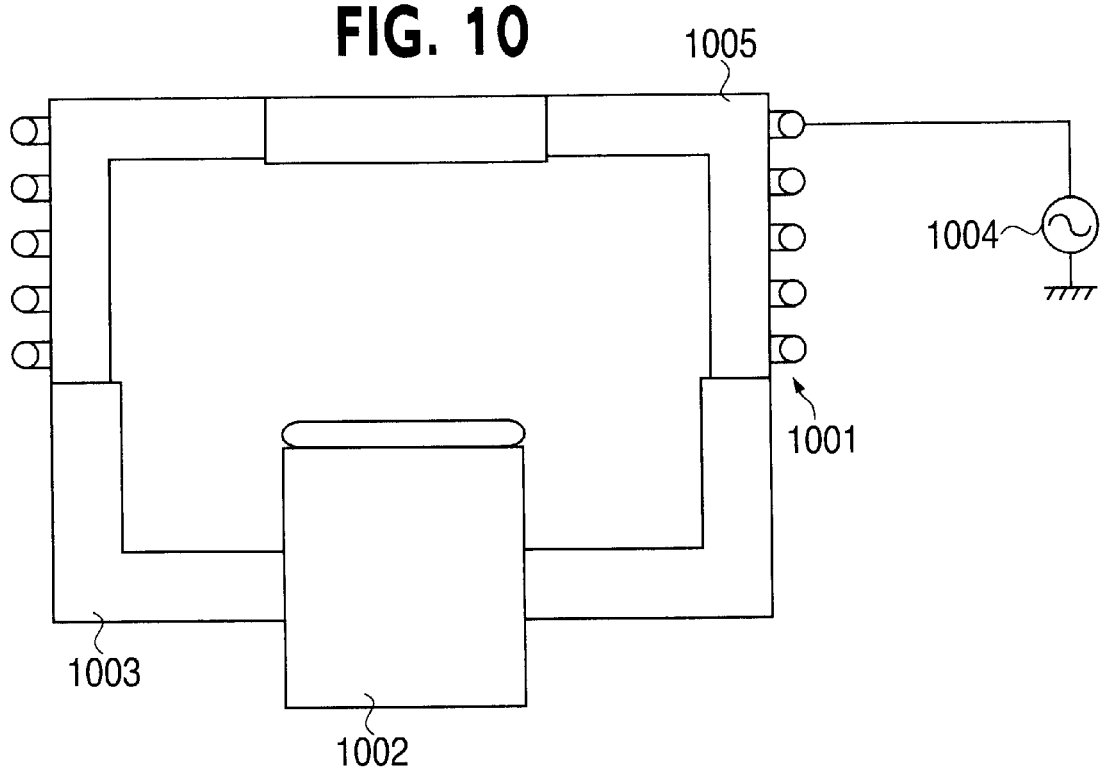
FIG. 10 is a cross-section of the chamber with coils imparting a magnetic in accordance with the present invention.
Figure 11:
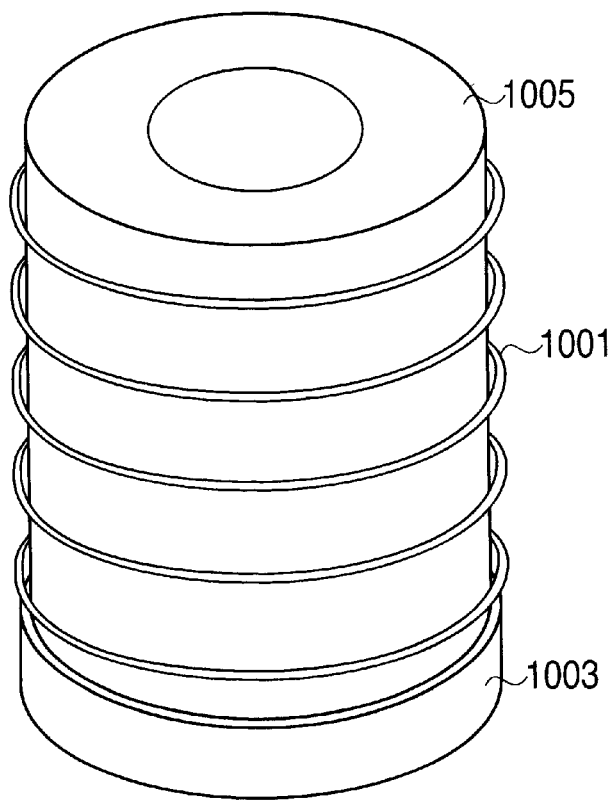
FIG. 11 is a perspective view of the chamber of FIG. 10.

FIG. 10 shows an example of a magnetic field inducing device surrounding chamber. Coils 1001 surround the upper portion of the chamber 1005. Source 1004 provides an electrical signal to the coils 1001 that, in turn, generate the desired magnetic field. FIG. 11 is an external view of the coils encircling the chamber of FIG. 10.

FIG. 12 shows an example of a permanent magnet magnetic field generating device. Suspended above the top 1005 of the chamber is permanent magnet 1201. The permanent magnet 1201 rotates (shown here as counter clockwise) in order to generate the desired magnetic field for processing the wafer.

Referring to FIG. 3, pedestal 102 includes a cooling medium passage 127, which is formed in pedestal 102. In order to cool pedestal 102 during wafer processing, a cooling medium such as water is circulated through medium passage 127. Cooling media may include water with ethyleneglycol (for example). In a gaseous state, other cooling media may be used. One advantage of using a liquid state cooling media is that gases generally have less heat capacity (meaning less effective) than liquid.

A first thermal transfer gas layer is provided between wafer W and the upper surface of plate 104. In this description, the first thermal transfer gas layer is a first helium layer. Other gases may be used including nitrogen, neon, argon, and other inert gases. One advantage of using helium is that it provides better heat transfer than these other gases. The helium layer is provided by a first helium supply 109 and a gas passage 110. A pressure controller 112 responsive to control signals from a system control computer 114 controls the pressure of the first helium layer. Pressure controller 112 is responsive to system computer control 114 for controlling the pressure of the first helium layer to be at a pressure in a range in which thermal conductivity of the helium is substantially constant with respect to pressure changes. A more detailed figure of pressure controller is shown in FIG. 13.

FIG. 13 shows a pressure controller for controlling the pressure of He in line 1304. He is introduced through passage 1301. The He is passed through mass flow controller (MFC) 1032. The He passage splits with one path 1304 providing He to wafer W and another path 1035 to a pump (not shown). Pressure gauge 1303 measures the pressure in passage 1304. This information is transmitted back to the MFC 1302 where the MFC 1302 (under computer control adjusts the flow rate to achieve the desired pressure in passage 1304.

Figure 4:
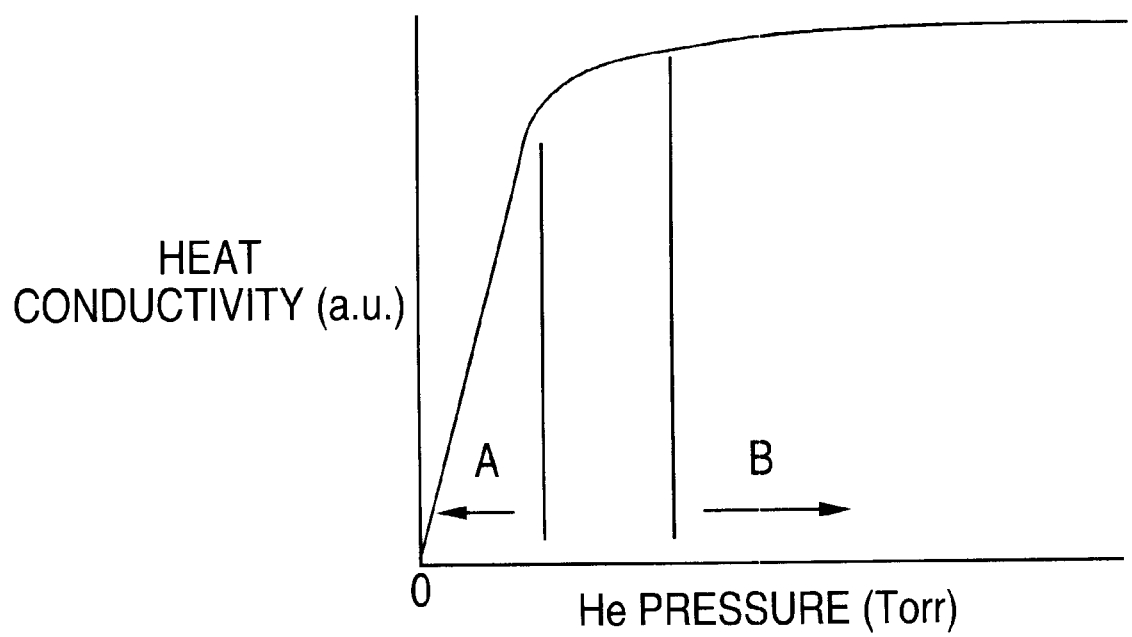
FIG. 4 is a graph of thermal conductivity of helium as a function of helium pressure.

The flow rate of the helium may be set to achieve the above results. The pressure of the first helium layer may be set with an upper limit of about 10 Torr. FIG. 4 is a graph of the thermal conductivity of helium as a function of helium pressure. Pressure controller 112 is responsive to system control computer 114 for controlling the pressure of the first helium layer to be at a pressure which is in the range "B" shown in FIG. 4. As can be seen by reference to the graph of FIG. 4, the thermal conductivity of helium is substantially constant with respect to changes in the helium pressures in range B. Since the thermal conductivity of the first helium layer between the wafer W and the upper surface of plate 104 is relatively insensitive to helium pressure, the helium leak at the edges does not significantly degrade the temperature uniformity across the wafer. In addition, the relatively high thermal conductivity of the first helium layer provides for good thermal transfer between the wafer W and the plate 104. Since there is a low "thermal resistance" between the wafer W and the plate 104, the wafer W and the plate 104 will be at substantially the same temperature. Thus, one or more temperature sensors 130 such as thermocouples provided on the plate 104 can be utilized to provide a reliable indication of the temperature of the wafer W. For example, if the RF bias provided by RF power supply 109 is 2000 W and the thickness of the first helium layer is about 100 micrometers, the temperature difference between the wafer and the plate 104 is expected to be less than 10°. This temperature indication is supplied to system control computer 114. As will be described below, the system control computer uses the temperature indication from the thermocouples for controlling the pressure controller 122 to control wafer temperature. It will be apparent that, if desired or necessary, such temperature differences can be accounted for using data generated by a monitor wafer configured with temperature sensors such as thermocouples and a plate 104 configured with temperature sensors such as thermocouples. The temperatures of the monitor wafer and of the plate can be determined at a variety of operating conditions such that a relationship between wafer temperature and plate temperature at these various operating conditions is generated. Using the relationship thus generated and the particular operating conditions, a temperature measured at the plate can be converted into a wafer temperature. The data can be stored in a memory of the system control computer. The above-described technique for measuring wafer temperature may be utilized during the processing of actual production wafers and is not limited to monitor (test) wafers. Other techniques for measuring the temperature of the plate may be utilized and the present invention is not limited to the use of thermocouples. For example, infrared detectors may be utilized when materials which are opaque to infrared radiation are used to form plate 104.

The space between plate 104 and the upper surface of pedestal 102 is filled with a second thermal transfer gas layer. The second thermal transfer gas may be same or different than the first thermal transfer gas. While various gases may be used, one advantage for using the same gas is limiting the number of supplied products needed for processing. In this description, the second thermal transfer gas layer is a second helium layer. The second helium layer is provided by a second helium supply 118 and a gas passage 120. A pressure controller 122 responsive to control signals from system control computer 114 controls the pressure of the second helium layer. Pressure controller 122 is responsive to system control computer 114 for controlling the pressure of the second helium layer. Pressure controller 122 is responsive to system control computer 114 for controlling the pressure of the second helium layer to be at a pressure in a range in which the thermal conductivity of the helium changes in accordance with changes in the helium pressure. For example, the pressure of the second helium layer is between about 2 Torr and about 10 Torr. With reference to the graph of the thermal conductivity of helium as a function of helium pressure shown in FIG. 4, pressure controller 12 is responsive to system control computer 114 for controlling the pressure of the second helium layer to be at a pressure in the range "A". As can be seen by reference to the graph of FIG. 4, the thermal conductivity of helium varies in accordance with the helium pressure for helium pressures in range A. Since the thermal conductivity of the second helium layer between the plate 104 and the upper surface of the pedestal 102 can be varied by varying the helium pressure, the amount of heat which is transferred to the pedestal 102 from the plate can be controlled, thereby enabling control of the wafer temperature. For example, by controlling the helium pressure to be at a low pressure in range A, the thermal conductivity can be made small, thereby reducing the amount of heat transferred to the pedestal. By controlling the helium pressure to be at a high pressure in range A, the thermal conductivity can be increased, thereby increasing the amount of heat transferred to the pedestal. By controlling the amount of heat transferred to the pedestal 102, the temperature of the wafer W can be controlled.

System control computer 114 uses temperature information from the temperature sensors 130 to control pressure controller 122. For example, assume that a particular process requires that the wafer W be maintained at a particular desired temperature. If temperature sensors 130 provide a signal to system control computer 114 indicating that the temperature of wafer W is higher than the desired temperature, system control computer 114 controls pressure controller 12 to increase the pressure of the second helium layer. By increasing the pressure of the second helium layer, the thermal conductivity of the helium is increased, thereby increasing the amount of heat transferred from the wafer W and plate 104 to the cooled pedestal 102. In this way, the temperature of the wafer may be decreased back toward the desired temperature. If temperature sensors 130 provide a signal to system control computer 114 indicating that the temperature of wafer W is lower than the desired temperature, system control computer controls pressure controller 122 to decrease the pressure of the second helium layer. By decreasing the pressure of the second helium layer, the thermal conductivity of the helium is decreased, thereby decreasing the amount of heat transferred from the wafer W and plate 104 to the cooled pedestal 102. In this way, the temperature of the wafer may be increased back toward the desire temperature. It will be apparent that system control computer 114 may be configured to maintain the wafer temperature in a particular temperature range based on the temperature control signals from temperature sensors 130.

System control computer 114 may be any computer which is capable of controlling pressure controllers 112 and 122 in response to temperature measurements of the plate 104. Generally, such a system control computer will also control the overall wafer processing by controlling the introduction of the process gases via gas supply section 121, the evacuation of processing chamber 101 via vacuum port 115, the loading and unloading of the wafer, the switching of the DC power supply to activate/deactivate the electrostatic chuck, the RF power supply and the magnetic field generator, other conditions in the processing chamber such as temperature and the like. The system control computer will generally include a central processing unit (CPU), a memory for storing a control program for controlling the overall operation of he processing chamber, and input/output devices such as a keyboard, a mouse, a printer, a display, etc.

Thus, the wafer processing apparatus shown in FIG. 3 and described above for a uniform temperature across a wafer arranged on the upper surface of plate 104 because a first thermal transfer gas layer at a pressure in a range in which the thermal conductivity of the first thermal transfer gas layer at a pressure in a range in which the thermal conductivity of the first thermal transfer gas is substantially constant with respect to changes in the gas pressure is provided between the wafer W and the upper surface of plate 104. In addition, since the thermal resistance of the first thermal transfer gas layer is low, the temperature of the plate is substantially the same as the temperature of the wafer W. Thus, by measuring the temperature of the plate 104 using well known techniques such as thermocouples or infrared detectors, a reliable indication of the wafer temperature during the processing of production wafers may be obtained. To the extent differences exist between the temperature of the wafer and the plate 104, a relationship between these temperatures under a variety of operating conditions can be determined and then used to convert the plate temperature into a wafer temperature. A second thermal transfer gas layer is provided between the plate and the pedestal. The pressure of this second thermal transfer gas layer is provided between the plate and the pedestal. The pressure of this second thermal transfer gas layer is maintained at a pressure in a pressure range in which the thermal conductivity of the second thermal transfer gas varies as a function of gas pressure. In this way, the pressure of the second thermal transfer gas varies as a function of the gas pressure. In this way, the pressure of the second thermal transfer gas layer may be changed to change the amount of heat which is transferred to the pedestal from the wafer and the plate. By controlling the amount of heat transferred to the pedestal from the wafer and the plate, the temperature of the wafer may be controlled.

The apparatus has been described above in terms of transferring heat from the wafer and the plate to a cooled pedestal. Of course, the wafer processing apparatus described above may be utilized to heat the wafer by circulating a heating medium (rather than a cooling medium) through passage 127.

Each of the patents identified above is hereby incorporated by reference into the present disclosure.

While there has been shown and described various embodiments of the invention, it will be evident to those skilled in the art that various modifications may be made thereto without departing from the spirit and scope of the invention as set forth in the appended claims.

What is claimed is:

1. A wafer processing apparatus comprising:

a processing chamber;

a plate arranged in said processing chamber for supporting a wafer;

an RF power supply source connected to said plate, for supplying an RF power to said plate to generate a plasma on the wafer;

a DC power supply source connected to said plate, for supplying a DC power to said plate to hold the wafer on said plate;

a pedestal spaced apart from said plate;

a thermal medium passage disposed in said pedestal for circulating one of a cooling medium and a heating medium and for transferring thermal energy between said pedestal and said one of said mediums;

a first gas delivery mechanism for providing a first gas layer between said plate and said wafer;

a second gas delivery mechanism for providing a second gas layer in the space between said pedestal and said plate;

a first pressure controller for controlling a pressure of the first gas layer;

a second pressure controller for controlling a pressure of the second gas layer; and, a control circuit for controlling said first pressure controller to control the pressure of the first gas layer such that the first gas layer is at a pressure in a pressure range in which a thermal conductivity of the first gas layer is substantially constant with respect to changes in pressure of the first gas layer and for controlling said second pressure controller to control the pressure of the second gas layer such that the second gas layer is at a pressure in a pressure range in which a thermal conductivity of the second gas layer changes with respect to changes in pressure of the second gas layer for controlling an amount of heat transferred to/from said pedestal.

2. The wafer processing apparatus according to claim 1, wherein the first gas layer is a helium gas layer and the second gas layer is a helium gas layer.

3. The wafer processing apparatus according to claim 1, wherein said control circuit controls said first pressure controller such that the first gas layer is maintained at a pressure of about 10 Torr.

4. The wafer processing apparatus according to claim 1, wherein said control circuit controls said second pressure controller such that the second gas layer is maintained at a pressure in a pressure range of about 2 Torr to about 10 Torr.

5. The wafer processing apparatus according to claim 1, further comprising:
   at least one temperature sensor arranged to sense a temperature of said plate and to provide a temperature signal to said control circuit, wherein
   said control circuit controls said second pressure controller in accordance with the temperature signal provided by said at least one temperature sensor.

6. The wafer processing apparatus according to claim 5, wherein said control circuit further comprises:
   a memory for storing data which relates temperatures of said plate sensed by said at least one temperature sensor to temperatures of a wafer supported on said plate.

7. The wafer processing apparatus according to claim 1, wherein the plate and the pedestal are fixed to each other by an O-ring, with the second gas layer provided in the space therebetween.

8. The wafer processing apparatus according to claim 1, wherein the diameter of the plate is smaller than the diameter of the wafer.

9. The wafer processing apparatus according to claim 1, wherein a through hole is provided in the center of the plate.

10. The wafer processing apparatus according to claim 1, wherein a through hole is provided in the center of the plate, and a plurality of through holes are provided in the peripheral portion of the plate.

11. The wafer processing apparatus according to claim 1, wherein a plurality of through holes are provided in a grid scheme in the plate.

12. The wafer processing apparatus according to claim 1, wherein the plate comprises a monopole electrostatic chuck.

13. The wafer processing apparatus according to claim 1, wherein the plate comprises a dipole electrostatic chuck.

14. The wafer processing apparatus according to claim 1, wherein the electrostatic chuck comprises a conductive layer sandwiched between two dielectric layers.

15. The wafer processing apparatus according to claim 1, wherein said mediums are each selected from the list consisting of water, ethylene glycol, and water mixed with ethylene glycol.

16. A wafer processing method comprising the steps of:
   placing a wafer on a plate disposed in a processing chamber;
   supplying an RF power to said plate to generate a plasma on the wafer by means of an RF power supply source connected to said plate;
   supplying a DC power to said plate to hold the wafer on said plate by means of a DC power supply source connected to said plate;
   supplying a first gas layer between said wafer and said plate;
   supplying a second gas layer in a space between said plate and a pedestal;
   circulating one of a cooling medium and a heating medium through a thermal medium passage disposed in said pedestal for transferring thermal energy between said pedestal and said one of said mediums;
   controlling a pressure of the first gas layer to be at a pressure in a pressure range in which a thermal conductivity of the first gas layer is substantially constant with respect to changes in pressure of the first gas layer; and
   controlling a pressure of the second gas layer to be at a pressure in a pressure range in which a thermal conductivity of the second gas layer changes with respect to changes in pressure of the second gas layer so as to control an amount of heat transferred to/from said pedestal,
   wherein the pressure of the second gas layer is continually changed.

17. The wafer processing method according to claim 16, wherein the first gas layer is a helium layer and the second gas layer is a helium layer.

18. The wafer processing method according to claim 16, comprising the further step of:
   measuring a temperature of said plate, wherein
   the pressure of the second gas layer is controlled based on the measured temperature of said plate.

19. A wafer processing method according to claim 16, wherein the plate and the pedestal are fixed to each other by an O-ring, with the second gas layer provided in the space therebetween.

20. The wafer processing method according to claim 16, wherein the diameter of the plate is smaller than the diameter of the wafer.

21. The wafer processing method according to claim 16, wherein a through hole is provided in the center of the plate.

22. The wafer processing method according to claim 16, wherein a through hole is provided in the center of the plate, and a plurality of through holes are provided in the peripheral portion of the plate.

23. The wafer processing method according to claim 16, wherein a plurality of through holes are provided in a grid scheme in the plate.

24. The wafer processing method according to claim 16, wherein the plate comprises a monopole electrostatic chuck.

25. The wafer processing method according to claim 16, wherein the plate comprises a dipole electrostatic chuck.

26. The wafer processing method according to claim 16, wherein the electrostatic chuck comprises a conductive layer sandwiched between two dielectric layers.

27. The wafer processing apparatus according to claim 16, wherein said mediums are each selected from the list consisting of water, ethylene glycol, and water mixed with ethylene glycol.

28. A control circuit for controlling a wafer processing apparatus which comprises:
   a processing chamber, a plate arranged in said processing chamber for supporting a wafer, an RE power supply source connected to said plate, for supplying an RF power to said plate to generate a plasma on the wafer, a DC power supply source connected to said plate, for supplying a DC power to said plate to hold the wafer on said plate, a pedestal spaced apart from said plate, a thermal medium passage disposed in said pedestal for circulating one of a cooling medium and a heating medium and for transferring thermal energy between said pedestal and said one of said mediums, a first gas delivery mechanism for providing a first gas layer between said plate and said wafer, a second gas delivery mechanism for providing a second gas layer in the space between said pedestal and said plate, a first pressure controller for controlling a pressure of the first gas layer, and a second pressure controller for controlling a pressure of the second gas layer, said control circuit controlling said first pressure controller to control the pressure of the first gas layer such that the first gas layer is at a pressure in a pressure range in which a thermal conductivity of the first gas layer is substantially constant with respect to changes in pressure of the first gas layer and said control circuit controlling said second pressure controller to control the pressure of the second gas layer such that the second gas layer is at a pressure in a pressure range in which a thermal conductivity of the second gas layer changes with respect to changes in pressure of the second gas layer so as to control an amount of heat transferred to/from said pedestal.

29. The control circuit according to claim 28, wherein said control circuit controls said second pressure controller based an a temperature signal from a temperature sensor arranged to sense a temperature of said plate.

30. The control circuit according to claim 29, further comprising a memory for storing data which relates temperatures of said plate to temperatures of a wafer supported on said plate.

31. The wafer processing apparatus according to claim 28, wherein the plate and the pedestal are fixed to each other by an O-ring, with the second gas layer provided in the space therebetween.

32. The wafer processing apparatus according to claim 28, wherein the diameter of the plate is smaller than the diameter of the wafer.

33. The wafer processing apparatus according to claim 28, wherein a through hole is provided in the center of the plate.

34. The wafer processing apparatus according to claim 28, wherein a through hole is provided in the center of the plate, and a plurality of through holes are provided in the peripheral portion of the plate.

35. The wafer processing apparatus according to claim 28, wherein a plurality of through holes are provided in a grid scheme in the plate.

36. The wafer processing apparatus according to claim 28, wherein the plate comprises a monopole electrostatic chuck.

37. The wafer processing apparatus according to claim 28, wherein the plate comprises a dipole electrostatic chuck.

38. The wafer processing apparatus according to claim 28, wherein the electrostatic chuck comprises a conductive layer sandwiched between two dielectric layers.

39. The wafer processing apparatus according to claim 28, wherein said mediums are each selected from the list consisting of water, ethylene glycol, and water inked with ethylene glycol.

40. A wafer processing apparatus comprising:
a processing chamber;
a plate arranged in said processing chamber for supporting a wafer;
an RF power supply source connected to said plate, for supplying an RF power to said plate to generate a plasma on the wafer;
a DC power supply source connected to said plate, for supplying a DC power to said plate to hold the wafer on said plate;
a pedestal spaced apart from said plate;
a thermal medium passage disposed in said pedestal for circulating one of a cooling medium and a heating medium and for transferring thermal energy between said pedestal and said one of said mediums;
a gas delivery mechanism for providing a gas layer in the space between said pedestal and said plate; and
a pressure controller for controlling a pressure of the gas layer such that the pressure is in a pressure range in which a thermal conductivity of the gas layer changes with respect to changes in pressure of the gas layer.

41. The wafer processing apparatus according to claim 40, further comprising:
at least one temperature sensor arranged to sense a temperature of said plate and to provide a temperature signal to said control circuit, wherein
said control circuit controls said pressure controller in accordance with the temperature signal provided by said at least one temperature sensor.

42. The wafer processing apparatus according to claim 41, wherein said control circuit further comprises:
a memory for storing data which relates temperatures of said plate sensed by said at least one temperature sensor to temperatures of a wafer supported on said plate.

43. The wafer processing apparatus according to claim 40, wherein the pressure of the gas layer is continuously changed.

44. A wafer processing apparatus according to claim 43, wherein the plate and the pedestal are fixed to each other by an O-ring, with the second gas layer provided in the space therebetween.

45. The wafer processing apparatus according to claim 40, wherein the plate and the pedestal are fixed to each other by a O-ring, with the gas layer provided in the space therebetween.

46. The wafer processing apparatus according to claim 40, wherein the diameter of the plate is smaller than the diameter of the wafer.

47. The wafer processing apparatus according to claim 40, wherein a through hole is provided in the center of the plate.

48. The wafer processing apparatus according to claim 40, wherein a through hole is provided in the center of the plate, and a plurality of through holes are provided in the peripheral portion of the plate.

49. The wafer processing apparatus according to claim 40, wherein a plurality of through holes are provided in a grid scheme in the plate.

50. The wafer processing apparatus according to claim 40, wherein the plate comprises a monopole electrostatic chuck.

51. The wafer processing apparatus according to claim 40, wherein the plate comprises a dipole electrostatic chuck.

52. The wafer processing apparatus according to claim 40, wherein the electrostatic chuck comprises a conductive layer sandwiched between two dielectric layers.

53. The wafer processing apparatus according to claim 40, wherein said mediums are each selected from the list consisting of water, ethylene glycol, and water mixed with ethylene glycol.

54. A wafer processing apparatus comprising:
a processing chamber,
a plate arranged in said processing chamber for supporting a wafer;
a pedestal spaced apart from said plate;
a thermal medium passage disposed in said pedestal for circulating one of a cooling medium and a heating medium and for transferring thermal energy between said pedestal and said one of said mediums;
a gas delivery mechanism for providing a gas layer in the space between said pedestal and said plate; and
a pressure controller for controlling a pressure of the gas layer such that the pressure is in a pressure range in which a thermal conductivity of the gas layer cages with respect to changes in pressure of the gas layer.

55. The wafer processing apparatus according to claim 54, wherein the gas layer is a helium gas layer.

56. The wafer processing apparatus according to claim 54, wherein said pressure controller controls said pressure such that the gas layer is maintained at a pressure in a pressure range of about 2 Torr to about 10 Torr.

57. The wafer processing apparatus according to claim 54, wherein said thermal medium is selected from the list consisting of water, ethylene glycol, and water mixed with ethylene glycol.

58. A method of cooling a wafer during wafer processing, said wafer being held on a plate disposed in a processing chamber, said processing chamber having a pedestal spaced apart from said plate and a gas delivery mechanism for providing a gas layer in the space between said pedestal and said plate, said pedestal having a thermal medium passage disposed therein for circulating one of a cooling medium and a heating medium and for transferring thermal energy between said pedestal and said one of said mediums; the method comprising the steps of:

circulating said one of said mediums through said thermal medium passage; and controlling a pressure of said gas layer so as to control an amount of heat transferred from said plate to said one of said mediums through said pedestal.

59. The method of claim 58, wherein the gas layer is a helium layer.

60. The method of claim 58, wherein said gas layer pressure is maintained at a pressure in a pressure range of about 2 Torr to about 10 Torr.

61. The method of claim 58, further comprising the step of measuring a temperature of said plate, wherein the pressure of the gas layer is controlled based on the measured temperature of the plate.

* * * * *

UNITED STATES PATENT AND TRADEMARK OFFICE
CERTIFICATE OF CORRECTION

PATENT NO.   : 6,406,545 B2
DATED        : June 18, 2002
INVENTOR(S)  : Naohiro Shoda et al.

It is certified that error appears in the above-identified patent and that said Letters Patent is hereby corrected as shown below:

Column 10,
Line 55, "RE" has been replaced with -- RF --.

Signed and Sealed this

First Day of April, 2003

JAMES E. ROGAN
*Director of the United States Patent and Trademark Office*